United States Patent
Huang et al.

(10) Patent No.: US 12,127,358 B2
(45) Date of Patent: Oct. 22, 2024

(54) MIDDLE FRAME, ELECTRONIC DEVICE, AND METHOD FOR MANUFACTURING MIDDLE FRAME

(71) Applicants: Futaijing Precision Electronics (Yantai) Co., Ltd., Yantai (CN); HON HAI PRECISION INDUSTRY CO., LTD., New Taipei (TW)

(72) Inventors: Wen-Bin Huang, New Taipei (TW); Hsiu-Fu Li, New Taipei (TW); Je-Wei Chiang, New Taipei (TW); Yi-Ren Fang, New Taipei (TW); Yu-Cheng Zhang, New Taipei (TW); Yu-Jen Chuang, New Taipei (TW)

(73) Assignees: Futaijing Precision Electronics (Yantai) Co., Ltd., Yantai (CN); HON HAI PRECISION INDUSTRY CO., LTD., New Taipei (TW)

( * ) Notice: Subject to any disclaimer, the term of this patent is extended or adjusted under 35 U.S.C. 154(b) by 274 days.

(21) Appl. No.: 17/701,857

(22) Filed: Mar. 23, 2022

(65) Prior Publication Data

US 2022/0322549 A1    Oct. 6, 2022

(30) Foreign Application Priority Data

Apr. 2, 2021    (CN) .......................... 202110360152.2

(51) Int. Cl.
| | |
|---|---|
| H05K 5/02 | (2006.01) |
| G06F 1/16 | (2006.01) |
| H04M 1/02 | (2006.01) |
| H05K 5/03 | (2006.01) |

(52) U.S. Cl.
CPC ............. *H05K 5/0217* (2013.01); *H05K 5/03* (2013.01); *G06F 1/1626* (2013.01); *H04M 1/026* (2013.01)

(58) Field of Classification Search
CPC ............................... H05K 5/03; H05K 5/0217
See application file for complete search history.

(56) References Cited

U.S. PATENT DOCUMENTS

| | | | | |
|---|---|---|---|---|
| 8,975,540 | B2* | 3/2015 | Mareno | H04M 1/0249 174/559 |
| 10,631,420 | B1* | 4/2020 | Xiong | H05K 5/04 |
| 2013/0279442 | A1* | 10/2013 | Tiwari | H04W 76/50 370/329 |
| 2014/0268516 | A1 | 9/2014 | Fathollahi et al. | |

(Continued)

FOREIGN PATENT DOCUMENTS

| | | |
|---|---|---|
| CN | 110480922 A | 11/2019 |
| CN | 110732839 A | 1/2020 |

*Primary Examiner* — Daniel J Rohrhoff
(74) *Attorney, Agent, or Firm* — ScienBiziP, P.C.

(57) ABSTRACT

A middle frame includes an inner frame, a blocking member, and a covering member. The inner frame includes an outer surface and an inner surface opposite the outer surface. The inner frame further comprises at least one mounting hole penetrating the outer surface and the inner surface, the at least one mounting hole comprises an opening at the outer surface. The covering member covers the outer surface, and the blocking member is disposed between the covering member and the outer surface so as to cover the opening of the at least one mounting hole at the outer surface. An electronic device including the middle frame and a method for manufacturing the middle frame are also provided.

10 Claims, 5 Drawing Sheets

(56) References Cited

U.S. PATENT DOCUMENTS

| | | | |
|---|---|---|---|
| 2017/0134545 A1* | 5/2017 | Lee | H04R 1/025 |
| 2019/0246511 A1* | 8/2019 | Huang | H04M 1/0202 |
| 2020/0060034 A1* | 2/2020 | Wei | H05K 5/04 |
| 2020/0080580 A1* | 3/2020 | Clavelle | H05K 5/0008 |
| 2021/0157198 A1* | 5/2021 | Hu | H04M 1/026 |
| 2023/0121011 A1* | 4/2023 | Baek | G06F 1/1626 |
| | | | 361/679.03 |
| 2023/0232558 A1* | 7/2023 | Bartlow | H04M 1/185 |
| | | | 361/807 |

* cited by examiner

MIDDLE FRAME, ELECTRONIC DEVICE, AND METHOD FOR MANUFACTURING MIDDLE FRAME

FIELD

The subject matter herein generally relates to a middle frame, an electronic device, and a method for manufacturing the middle frame.

BACKGROUND

An electronic device can include a middle frame. The middle frame includes a metal inner frame and a plastic member formed on the metal inner frame.

The metal inner frame is usually provided with holes for mounting components (such as power buttons). When the plastic member is formed on the metal inner frame by injection molding, some plastic may enter the holes, preventing geometric precision and clean edges of the holes and sometimes blocking the holes. Thus, there is a room for improvement in the art.

BRIEF DESCRIPTION OF THE DRAWINGS

Implementations of the present technology will now be described, by way of example only, with reference to the attached figures.

DETAILED DESCRIPTION

Figure 1:
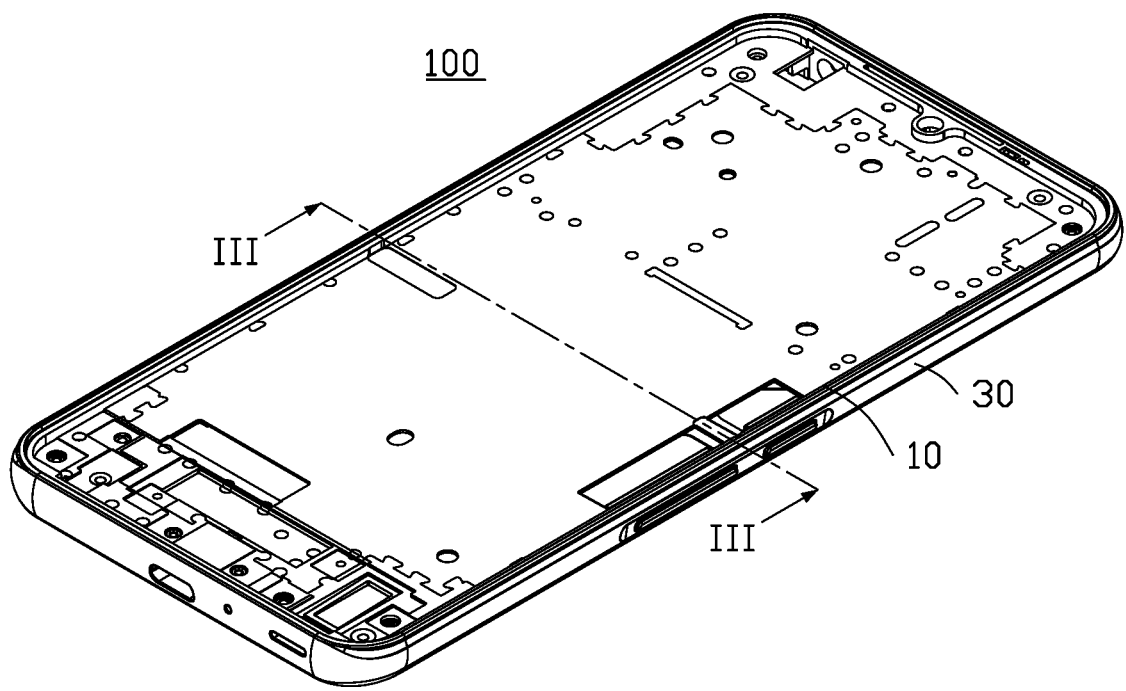
FIG. 1 is a diagrammatic view of an embodiment of a middle frame according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Some embodiments of the present disclosure will be described in detail with reference to the drawings. If no conflict, the following embodiments and features in the embodiments can be combined with each other.

Figure 2:
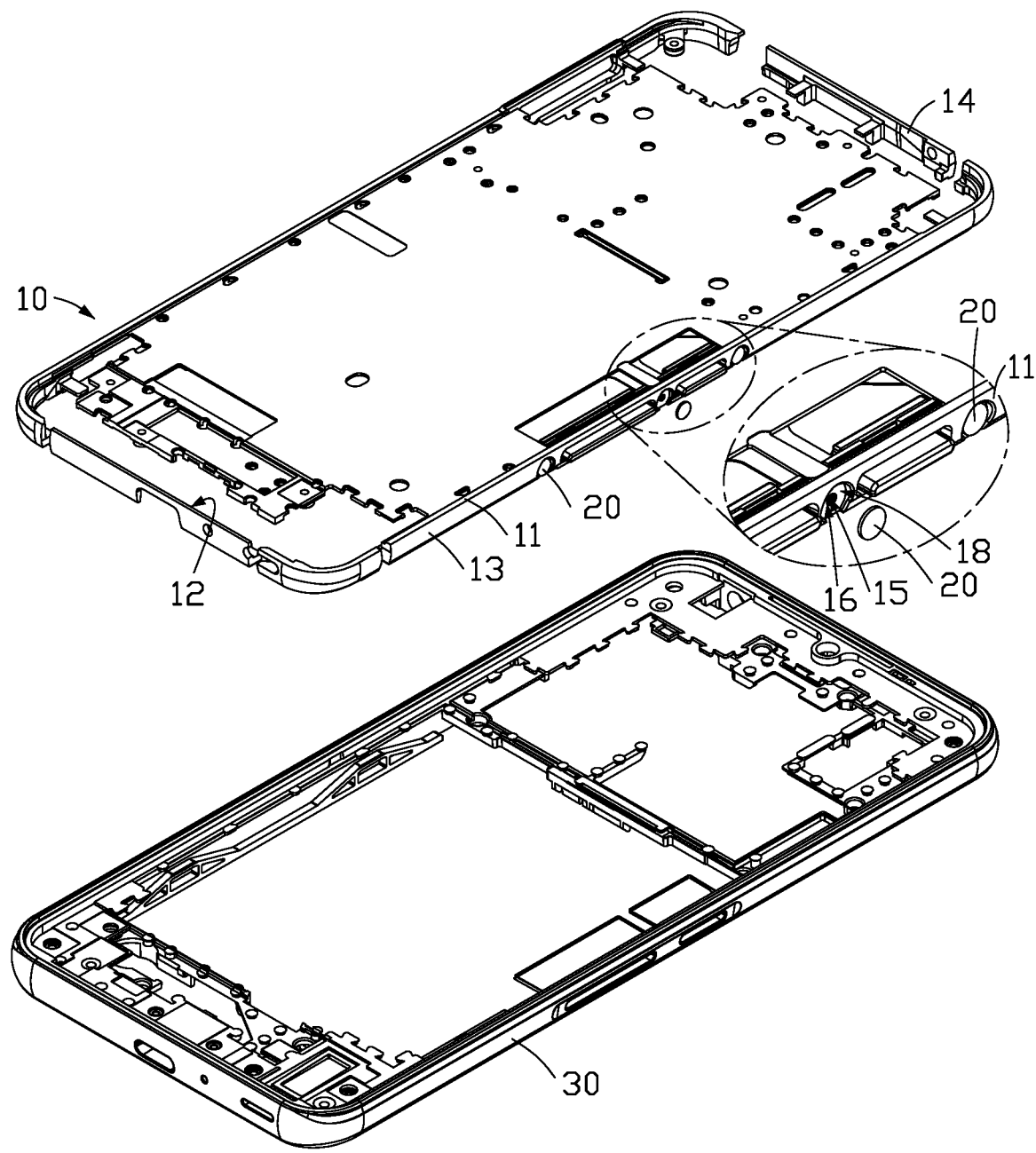
FIG. 2 is an exploded view of the middle frame of FIG. 1.
Figure 3:
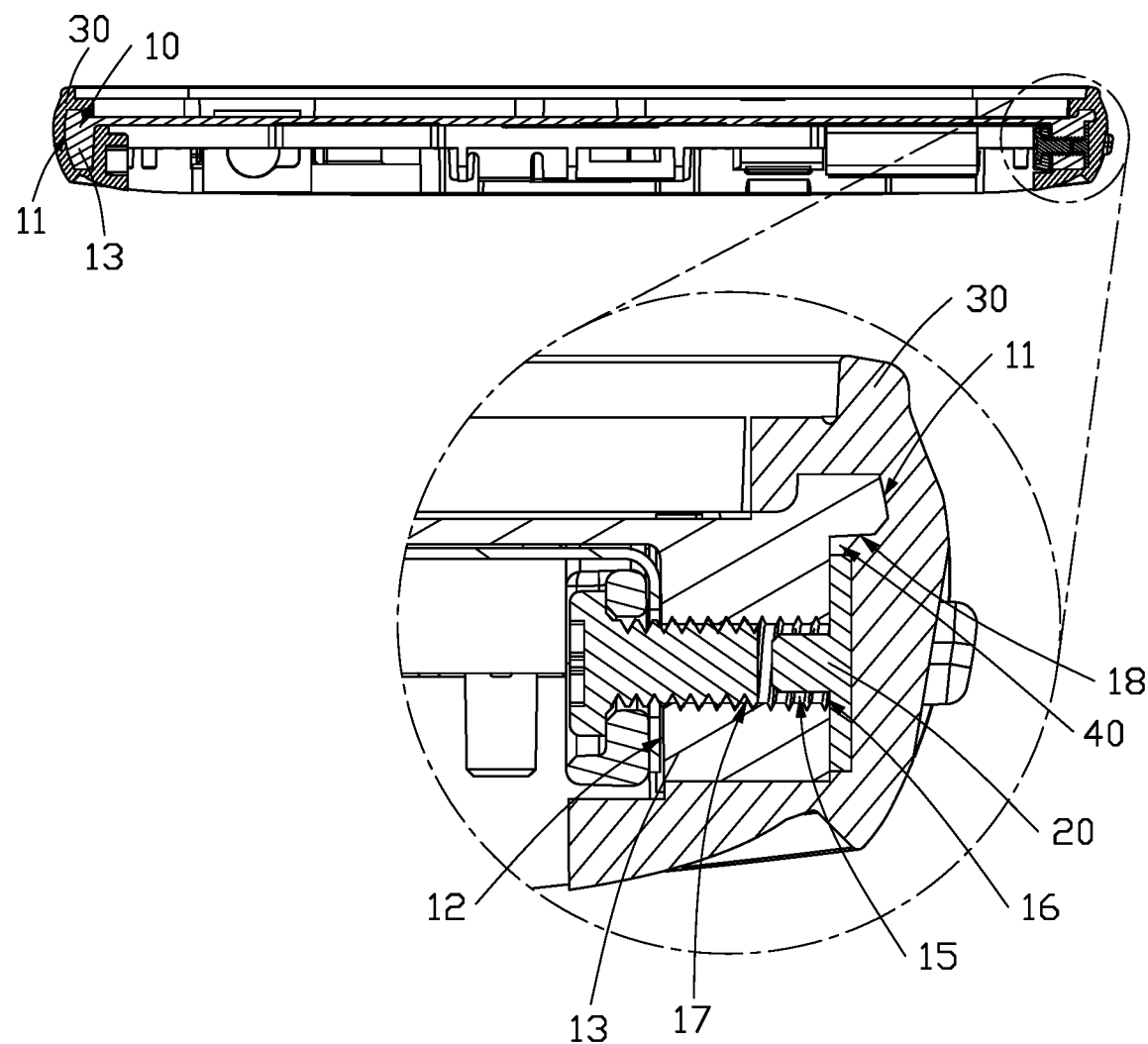
FIG. 3 is a cross-sectional view along line in FIG. 1.

Referring to FIGS. 1, 2, and 3, an embodiment of a middle frame 100 is provided. The middle frame 100 includes an inner frame 10, a blocking member 20, and a covering member 30. The inner frame 10 includes an outer surface 11 and an inner surface 12 opposite the outer surface 11. The covering member 30 covers the outer surface 11 of the inner frame 10. The blocking member 20 is disposed in the inner frame 10, and is disposed between the inner frame 10 and the covering member 30.

Referring to FIGS. 2 and 3, the inner frame 10 includes a first frame 13 and a second frame 14 connected to the first frame 13. In the embodiment, the inner frame 10 is substantially rectangular. The first frame 13 denotes the longer side of the inner frame 10, and the second frame 14 denotes the shorter side. The first frame 13 includes at least one mounting hole 15 penetrating the outer surface 11 and the inner surface 12 of the first frame 13. The mounting hole 15 includes an opening 16 at the outer surface 11. In the embodiment, the first frame 13 is provided with three mounting holes 15, the number of the mounting holes 15 can be set according to actual requirements. In some embodiments, the first frame 13 is provided with a thread 17 in each of the mounting holes 15, that is, each of the mounting holes 15 is a threaded hole. The mounting holes 15 can be used to fix internal components of an electronic device 200 (shown in FIG. 4), such as volume buttons or power buttons.

Referring to FIGS. 2 and 3, the outer surface 11 of the first frame 13 is recessed toward the inner surface 12 to form a groove 18. The opening 16 is disposed at a bottom of the groove 18. The blocking member 20 is disposed in the groove 18 and covers the opening 16. In the embodiment, the blocking member 20 is made of iron and is circular. In other embodiments, the blocking member 20 can be made of other materials, such as plastic, glass, or the like.

Referring to FIGS. 2 and 3, the covering member 30 is wrapped around the outer surface 11 of the inner frame 10. The blocking member 20 is disposed between the covering member 30 and the outer surface 11 of the inner frame 10. When assembling the inner frame 10 and the covering member 30, the blocking member 20 prevents a liquid resin used to form the covering member 30 and any other foreign matter from entering the mounting holes 15, so that the mounting holes 15 are not blocked or impeded.

Referring to FIGS. 2 and 3, an inner diameter of the groove 18 is larger than an outer diameter of the blocking member 20, so that the blocking member 20 can be disposed in the groove 18. That is, a gap 40 is formed between the blocking member 20 and an inner wall of the groove 18, and the covering member 30 also fills in the gap 40. When the covering member 30 and the inner frame 10 are assembled, a part of the liquid resin used to form the covering member 30 enters the groove 18 and flows into the gap 40. This effectively increases an area of contact between the covering member 30 and the inner frame 10, thereby improving strength of bonding between the inner frame 10 and the covering member 30. In some embodiments, along a direction perpendicular to the central axis of the opening 16, a thickness of the blocking member 20 is not more than a depth of the groove 18. That is, the blocking member 20 does not protrude from the groove 18.

In the embodiment, the blocking member 20 is disposed at the mounting holes 15 of the first frame 13. The blocking member 20 is fixed in the groove 18 and covers the opening 16 to prevent the liquid resin from entering the mounting holes 15 during the process of forming the covering member 30, thereby avoiding failure to install other components in the mounting holes 15. Compared with the related art which arranges a blind hole on the first frame 13 to replace the blocking member 20, production cost of the middle frame 100 is reduced in the present disclosure. Moreover, the blocking member 20 overcomes the problem of a minimum size limit for a nut in a blind hole, so the blocking member 20 meets requirements of the mounting holes 15 in any style or size of the middle frame 100.

Figure 4:
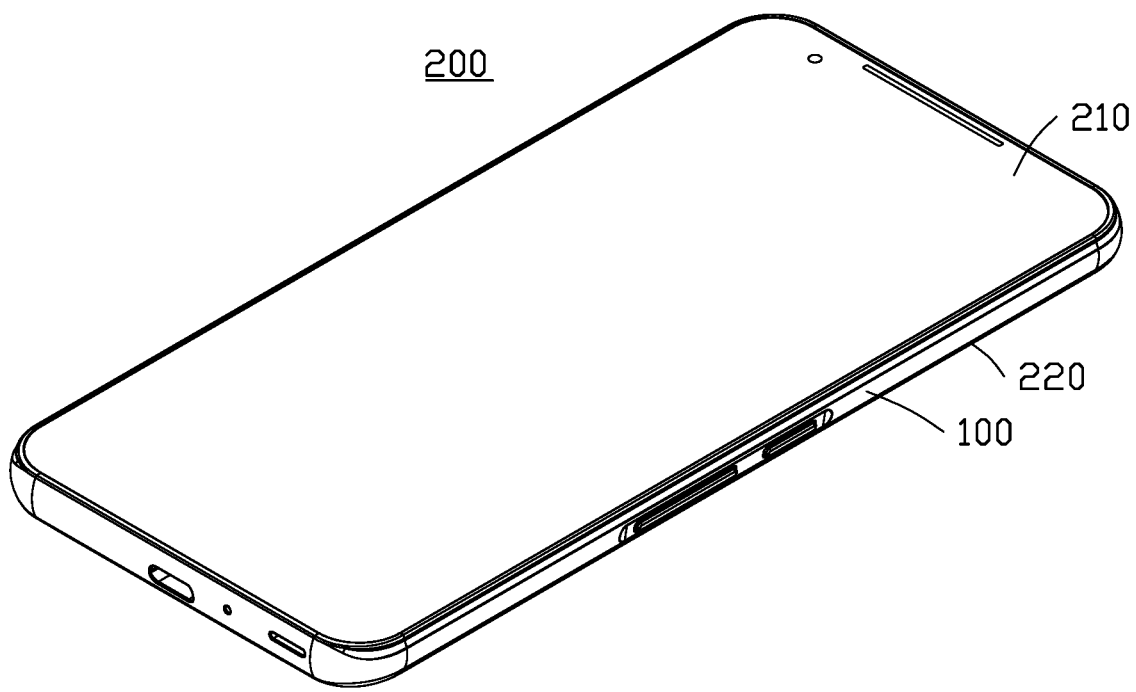
FIG. 4 is a diagrammatic view of an embodiment of an electronic device including the middle frame of FIG. 1 according to the present disclosure.

Referring to FIG. 4, an embodiment of an electronic device 200 is also provided. The electronic device 200 can be a mobile phone, a tablet computer, or the like. The electronic device 200 includes the middle frame 100, a first structural member 210, and a second structural member 220. The first structural member 210 and the second structural member 220 are disposed on opposite sides of the middle frame 100, and are fixed to the middle frame 100.

In the embodiment, the electronic device 200 is a mobile phone. The first structural member 210 is a screen, and the second structural member 220 is a battery housing. The electronic device 200 may further include internal components, such as batteries, circuit boards, processors, or the like, to implement functions of the electronic device 200. In some embodiments, the second structural member 220 and the covering member 30 can be integrally formed.

Figure 5:
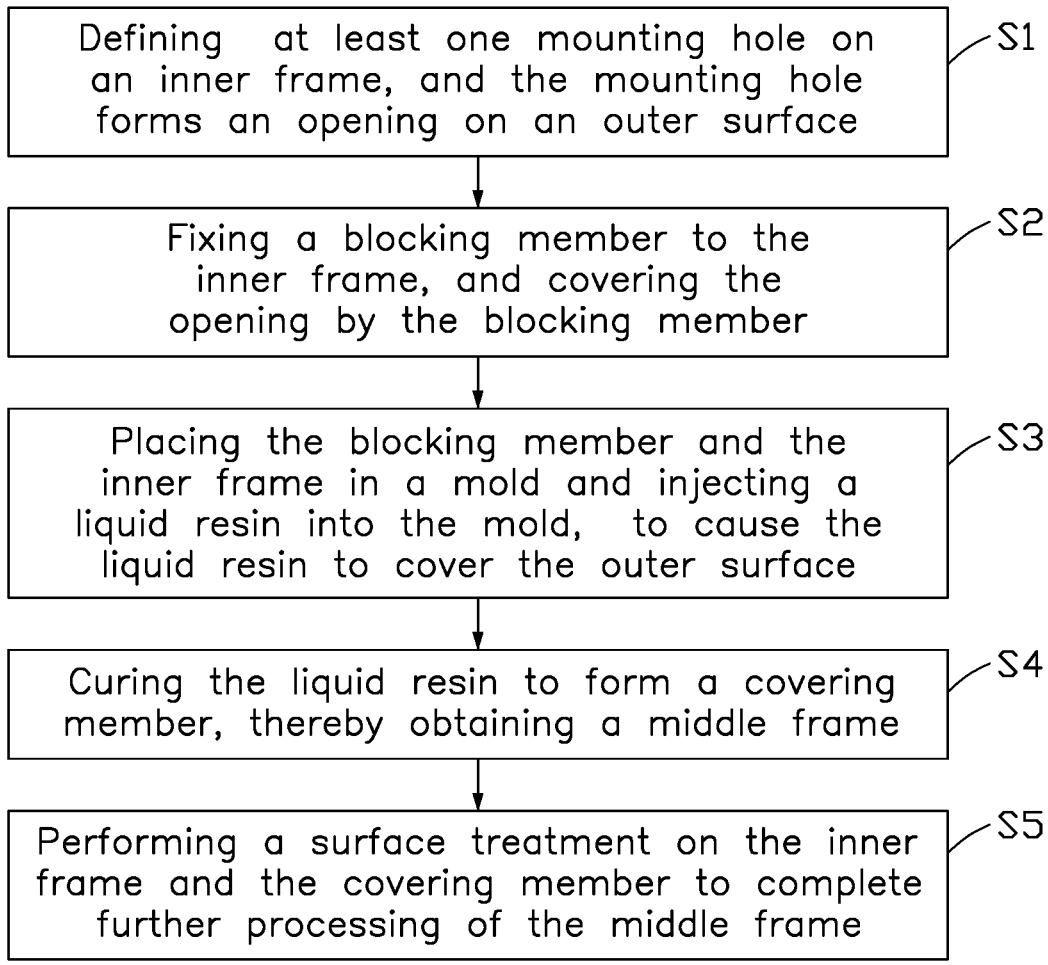
FIG. 5 is a flowchart of an embodiment of a method for manufacturing the middle frame of FIG. 1 according to the present disclosure.

Referring to FIG. 5, a method for manufacturing the middle frame 100 is provided. The method includes following steps.

Step S1: at least one mounting hole 15 is defined on an inner frame 10, and the at least one mounting hole 15 forms an opening 16 on an outer surface 11.

The at least one mounting hole 15 may have a thread 17, which can be formed by a molding or tapping machine.

Step S2: a blocking member 20 is fixed to the inner frame 10, and the blocking member 20 covers the opening 16.

In some embodiments, the blocking member 20 is made of iron and welded to the opening 16 of the at least one mounting hole 15, which blocks the opening 16. In the step S2, no gap is formed between the blocking member 20 and a bottom of a groove 18.

Step S3: the fixed blocking member 20 and the inner frame 10 are placed in a mold, and a liquid resin is injected into the mold, causing the liquid resin to cover the outer surface 11.

In the step S3, after the injection molding, the covering member 30 and the inner frame 10 are connected together. In other embodiments, the covering member 30 and the inner frame 10 may also be connected by a snap fitting.

Step S4: the liquid resin is cured to obtain the covering member 30, and the middle frame 100 is obtained.

In some embodiments, the method further includes Step S5, a fine processing is performed on the inner frame 10 and the covering member 30.

In the step S5, a surface treatment, such as polishing, sandblasting, or the like, is performed on the inner frame 10 and the covering member 30 to complete the processing of the middle frame 100.

The blocking member 20 can be made of at least one of aluminum, copper, and iron or alloys. In the embodiment, the material of the blocking member 20 is the same as that of the inner frame 10. When the blocking member 20 is fixed to the bottom of the groove 18, the blocking member 20 can also be fixed in the groove 18 of the first frame 13 by applying glue between the blocking member 20 and the first frame 13.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A middle frame comprising:
   an inner frame comprising an outer surface and an inner surface opposite the outer surface, the inner frame further comprising at least one mounting hole penetrating the outer surface and the inner surface, the at least one mounting hole comprising an opening at the outer surface;
   a covering member covering the outer surface; and
   a blocking member disposed between the covering member and the outer surface, the blocking member covering the opening;
   wherein the outer surface is recessed toward the inner surface to form a groove, the opening is disposed at a bottom of the groove, and the blocking member is disposed in the groove.

2. The middle frame of claim 1, wherein in a direction perpendicular to a central axis of the opening, a thickness of the blocking member is not more than a depth of the groove.

3. The middle frame of claim 1, wherein a gap is formed between the blocking member and an inner wall of the groove.

4. The middle frame of claim 1, wherein the blocking member is made of at least one of aluminum, copper, and iron.

5. The middle frame of claim 1, wherein the at least one mounting hole is a threaded hole.

6. An electronic device comprising:
   a middle frame comprising:
   an inner frame comprising an outer surface and an inner surface opposite the outer surface, the inner frame further comprising at least one mounting hole penetrating the outer surface and the inner surface, each of the at least one mounting hole comprising an opening at the outer surface;
   a covering member covering the outer surface; and
   a blocking member disposed between the covering member and the outer surface, the blocking member covering the opening;
   wherein the outer surface is recessed toward the inner surface to form a groove, the opening is disposed at a bottom of the groove, and the blocking member is disposed in the groove.

7. The electronic device of claim 6, wherein in a direction perpendicular to a central axis of the opening, a thickness of the blocking member is not more than a depth of the groove.

8. The electronic device of claim 6, wherein a gap is formed between the blocking member and an inner wall of the groove.

9. The electronic device of claim 6, wherein the blocking member is made of at least one of aluminum, copper, and iron.

10. The electronic device of claim 6, wherein the at least one mounting hole is a threaded hole.

* * * * *